(12) United States Patent
Choi et al.

(10) Patent No.: US 10,859,917 B2
(45) Date of Patent: Dec. 8, 2020

(54) PHOTORESIST STRIPPER COMPOSITION FOR MANUFACTURING LIQUID CRYSTAL DISPLAY

(71) Applicant: LTC Co., Ltd., Gyeonggi-do (KR)

(72) Inventors: Ho-Sung Choi, Gyeonggi-do (KR); Kwang-Hyun Ryu, Gyeonggi-do (KR); Jong-Il Bae, Gyeonggi-do (KR); Jong-Soon Lee, Gyeonggi-do (KR); Sang-Ku Ha, Incheon (KR); Hye-Sung Yang, Gyeonggi-do (KR); Mi-Yeon Han, Gyeonggi-do (KR); Hyo-Jin Lee, Seoul (KR)

(73) Assignee: LTC CO., LTD., Gyeonggi-Do (KR)

( * ) Notice: Subject to any disclaimer, the term of this patent is extended or adjusted under 35 U.S.C. 154(b) by 239 days.

(21) Appl. No.: 15/751,967

(22) PCT Filed: Aug. 10, 2016

(86) PCT No.: PCT/KR2016/008810
§ 371 (c)(1),
(2) Date: Feb. 12, 2018

(87) PCT Pub. No.: WO2017/026803
PCT Pub. Date: Feb. 16, 2017

(65) Prior Publication Data
US 2018/0239256 A1 Aug. 23, 2018

(30) Foreign Application Priority Data
Aug. 13, 2015 (KR) .................. 10-2015-0114310

(51) Int. Cl.
| | | |
|---|---|---|
| G03F 7/42 | (2006.01) | |
| C11D 7/32 | (2006.01) | |
| C11D 3/00 | (2006.01) | |
| C11D 11/00 | (2006.01) | |
| C11D 7/50 | (2006.01) | |
| C11D 7/26 | (2006.01) | |
| H01L 21/311 | (2006.01) | |
| C11D 3/20 | (2006.01) | |
| G03F 7/32 | (2006.01) | |
| H01L 21/027 | (2006.01) | |
| H01L 27/12 | (2006.01) | |

(52) U.S. Cl.
CPC ............ G03F 7/425 (2013.01); C11D 3/0073 (2013.01); C11D 3/2068 (2013.01); C11D 7/261 (2013.01); C11D 7/3218 (2013.01); C11D 7/5004 (2013.01); C11D 11/0047 (2013.01); G03F 7/32 (2013.01); G03F 7/426 (2013.01); H01L 21/0273 (2013.01); H01L 21/311 (2013.01); H01L 21/31133 (2013.01); H01L 27/124 (2013.01)

(58) Field of Classification Search
CPC ..... G03F 7/425; G03F 7/426; C11D 11/0047; C11D 3/0073; C11D 3/2068; C11D 7/261; C11D 7/3218; C11D 7/5004; H01L 21/0273; H01L 21/311; H01L 31/31133; H01L 27/124
USPC .......................................... 510/176; 430/331
See application file for complete search history.

(56) References Cited

U.S. PATENT DOCUMENTS

2014/0100151 A1 4/2014 Egbe et al.

FOREIGN PATENT DOCUMENTS

| | | |
|---|---|---|
| CN | 101614970 B | 12/2012 |
| JP | 2002072505 A | 3/2002 |
| JP | 2003114540 A | 4/2003 |
| JP | 2006173566 A | 6/2006 |
| JP | 2007114519 A | 5/2007 |
| JP | 2008003594 A | 1/2008 |
| KR | 102080076016 A | 8/2008 |
| KR | 101089211 B2 | 12/2011 |
| KR | 1020130128952 A | 11/2013 |
| KR | 1020130139482 A | 12/2013 |
| KR | 1020140044728 A | 4/2014 |

(Continued)

OTHER PUBLICATIONS

Computer-generated translation of KR 1089211 (Dec. 2011). (Year: 2011).*

(Continued)

*Primary Examiner* — John A McPherson
(74) *Attorney, Agent, or Firm* — McDonnell Boehnen Hulbert & Berghoff LLP

(57) ABSTRACT

The present disclosure relates to a photoresist stripper composition for manufacturing an LCD, and relates to an integrated photoresist stripper composition capable of being used in all processes for manufacturing a TFT-LCD. More specifically, the present disclosure relates to an aqueous photoresist stripper composition capable of being used in all of transition metal, potential metal and oxide semiconductor wires. The aqueous photoresist stripper composition includes (a) a potential metal and metal oxide corrosion inhibitor, (b) a transition metal corrosion inhibitor, (c) a primary alkanolamine, (d) a cyclic alcohol, (e) water, (f) an aprotic polar organic solvent, and (g) a protic polar organic solvent, and has an excellent ability to remove a degenerated photoresist produced after progressing a hard baked process, an implant process and a dry etch process in a semiconductor or flat display panel process, may be used in aluminum that is a potential metal, copper or silver that is a transition metal, and metal oxide wires at the same time, and may be introduced to organic film and COA processes.

7 Claims, No Drawings

(56) References Cited

FOREIGN PATENT DOCUMENTS

| KR | 101403515 B1 | 6/2014 |
| KR | 1020150026582 A | 3/2015 |
| WO | 2006129538 A1 | 5/2006 |
| WO | 2006129549 A1 | 12/2006 |

OTHER PUBLICATIONS

Computer-generated translation of KR 2013-0128952 (Nov. 2013). (Year: 2013).*
International Search Report for corresponding application No. PCT/KR2016/008810 dated Dec. 6, 2016.

* cited by examiner

PHOTORESIST STRIPPER COMPOSITION FOR MANUFACTURING LIQUID CRYSTAL DISPLAY

TECHNICAL FIELD

The present disclosure relates to a photoresist stripper composition for manufacturing an LCD, and relates to an integrated photoresist stripper composition capable of being used in all processes for manufacturing a TFT-LCD. More specifically, the present disclosure relates to an aqueous photoresist stripper composition capable of being used in all of transition metal, potential metal and oxide semiconductor wires.

BACKGROUND ART

In a flat panel display manufacturing process, a photo-lithography process has been widely used in forming a constant pattern on a substrate.

Such a photo-lithography process is largely formed with a series of processes such as an exposure process, a dry or wet etching process and ashing, and after applying and exposing a photoresist on a substrate, dry or wet etching was carried out thereon to form a pattern. Herein, the photoresist remaining on metal wires needs to be removed using a photoresist stripper.

Photoresist stripper compositions for an LCD process that have been generally used so far are mostly organic-based that does not include water, and alkanolamines, polar solvents or mixtures of glycols have been used.

As the alkanolamines, monoethanolamine (MEA), iso-propanolamine (MIPA) and the like have been used, and as the polar solvent, N-methyl pyrrolidone (NMP), sulfolene, dimethyl sulfoxide (DMSO) and the like have been used. In addition, as the glycols, mixtures of diethylene glycol mono-ethyl ether (EDG), diethylene glycol monobutyl ether (BDG), triethylene glycol ether (TEG) and the like have been used.

A photoresist remaining after an etching process is generally stripped using the photoresist stripper described above and then washed with water, and washing with water has a problem of corroding metal wires and producing alien substances due to readsorption of the photoresist. This is due to the fact that hydroxide ions are produced when alkanolamines are mixed with water resulting in a significant increase in corrosivity for metals including aluminum, and a special corrosion inhibitor is required for preventing metal wire corrosion. In addition, resistance against corrosion of a copper (Cu) metal wire film for amines is quite weak compared to an Al metal wire film. As a general organic stripper to use on a copper (Cu) wire film for an LCD, secondary alkanolamines are used, and a corrosion inhibitor is separately added. As for copper (Cu) corrosion of an organic stripper, a corrosion inhibitor is selected considering only corrosion by amine. However, in an aqueous stripper, corrosion by amine, and corrosion by a hydroxide group (OH—) produced by the amine need to be considered as well.

In addition, in a TFT-LCD aluminum (Al) wire film, a degenerated photoresist gone through a hard baked process, an implant process and a dry etch process in this order needs to be stripped, and herein, a photoresist stripping may not be perfect sometimes when using a weak basic amine by declining a photoresist removing ability after progressing hard baked and dry etch processes. In Korean Patent No. 10-0950779, aluminum (Al) and copper (Cu) metal wires are not corroded in a solution using a tertiary alkanolamine including water (1% to 50%) mixed with (without corrosion inhibitor addition) a polar solvent (including glycols), however, there has been a problem in that stripping of a degenerated photoresist was not perfect after progressing a hard baked process, an implant process and a dry etch process when using a weak basic alkanolamine (tertiary alkanolamine). Studies for resolving such problems have been required.

DISCLOSURE

Technical Problem

The present disclosure relates to a photoresist stripper composition for manufacturing an LCD.

The present disclosure is directed to providing a photoresist stripper composition for manufacturing an LCD having excellent anticorrosion and stripping ability regardless of water content for copper (Cu), aluminum (Al) and oxide metal wires.

The present disclosure is also directed to providing a photoresist stripper composition for manufacturing an LCD having an excellent degenerated photoresist removing ability after progressing a hard baked process, an implant process and a dry etch process.

One embodiment of the present disclosure relates to a photoresist stripper composition for manufacturing an LCD including (a) a potential metal and metal oxide corrosion inhibitor of the following Chemical Formula 1 in 0.01% by weight to 3% by weight; (b) a transition metal corrosion inhibitor of the following Chemical Formula 2 in 0.01% by weight to 3% by weight; (c) a primary alkanolamine in 1% by weight to 20% by weight; (d) a cyclic alcohol in 1% by weight to 30% by weight; (e) water in 0.1% by weight to 40% by weight; (f) an aprotic polar organic solvent in 1% by weight to 40% by weight; and (g) a protic polar organic solvent in 20% by weight to 60% by weight.

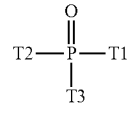

<Chemical Formula 1>

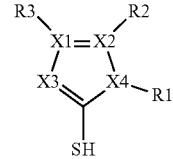

<Chemical Formula 2>

In Chemical Formula 1 and Chemical Formula 2, T1 and T2 are —O⁻NH₄⁺ or —O—H, T3 is —O—R or —R', R and R' are selected from the group consisting of hydrogen, a substituted or unsubstituted $C_1$ to $C_{12}$ alkyl group, a substituted or unsubstituted $C_2$~$C_{12}$ alkenyl group, a substituted or unsubstituted $C_2$~$C_{12}$ alkynyl group, a substituted or unsubstituted $C_3$~$C_{12}$ cycloalkyl group, a heterocycloalkyl group having 3 to 10 nuclear atoms, an alkyl acid, a $C_6$~$C_{20}$ aryl group, a heteroaryl group having 5 to 20 nuclear atoms, a $C_1$~$C_{12}$ alkyloxy group and a $C_6$~$C_{12}$ aryloxy group, X1, X2, X3 and X4 are C, N or O, R1 is selected from the group consisting of a substituted or unsubstituted $C_1$~$C_5$ alkyl group, a substituted or unsubstituted $C_2$~$C_5$ alkenyl group and a substituted or unsubstituted $C_2$~$C_5$ alkynyl group, and when X4 is O, R1 is not present, R2 and R3 are selected from the group consisting of a substituted or unsubstituted $C_1$ to $C_8$ alkyl group, a substituted or unsubstituted $C_2$~$C_8$ alkenyl group, a substituted or unsubstituted $C_2$~$C_8$ alkynyl group, a $C_3$~$C_8$ cycloalkyl group, a heterocycloalkyl group having 3 to 8 nuclear atoms, a $C_6$~$C_{20}$ aryl group, a heteroaryl group having 5 to 20 nuclear atoms, a $C_1$~$C_5$ alkyloxy group and a $C_6$~$C_{10}$ aryloxy group.

One embodiment of the present disclosure relates to a photoresist stripper composition for an LCD, wherein the transition metal corrosion inhibitor is any one or more selected from the group consisting of mercaptomethylimidazole, mercaptobenzimidazole, mercaptobenzothiadiazole and mercaptobenzioxazole.

One embodiment of the present disclosure relates to a photoresist stripper for an LCD, wherein the potential metal and metal oxide corrosion inhibitor is any one or more selected from the group consisting of monoammonium phosphate, diammonium phosphate, triammonium phosphate, methylphosphonic acid, ethylphosphonic acid, propylphosphonic acid, butylphosphonic acid, tert-butylphosphonic acid, pentylphosphonic acid, n-hexylphosphonic acid, triethyl phosphate, tripropyl phosphate, octylphosphonic acid, decylphosphonic acid, dodecylphosphonic acid, tetradecylphosphonic acid, octadecylphosphonic acid, hexyl phosphate, heptyl phosphate, octyl phosphate, nonyl phosphate, decyl phosphate and dodecyl phosphate.

Technical Solution

Embodiments of the present disclosure are provided in order to more fully describe the present disclosure to those having common knowledge in the art. The following embodiments may be modified to various different forms, and the scope of the present disclosure is not limited to the following embodiments. These embodiments are provided in order to make the present disclosure fuller and more complete, and to completely transfer ideas of the present disclosure to those skilled in the art.

In addition, a thickness or a size of each layer in the drawings may be exaggerated for the convenience of description or clarity, and like reference numerals designate like constituents in the drawings. As used in the present specification, the term "and/or" includes any one and all combinations of one or more of the corresponding listed items.

Terms used in the present specification are used for describing specific embodiments, and are not to limit the present disclosure. As used in the present specification, a singular form may include a plural form unless clearly indicating otherwise in the context. In addition, when used in the present specification, "include (comprise)" and/or "including (comprising)" specify the presence of mentioned shapes, numbers, steps, operations, members, factors and/or groups thereof, and do not exclude presence or addition of one or more other shapes, numbers, operations, members, factors and/or groups.

In the present disclosure, an "alkyl" means a monovalent substituent derived from linear or branched saturated hydrocarbon having 1 to 10 carbon atoms. Examples thereof may include methyl, ethyl, propyl, isobutyl, sec-butyl, pentyl, iso-amyl, hexyl and the like, but are not limited thereto.

In the present disclosure, an "alkenyl" means a monovalent substituent derived from linear or branched unsaturated hydrocarbon having 2 to 10 carbon atoms and having one or more carbon-carbon double bonds. Examples thereof may include vinyl, allyl, isopropenyl, 2-butenyl and the like, but are not limited thereto.

In the present disclosure, an "alkynyl" means a monovalent substituent derived from linear or branched unsaturated hydrocarbon having 2 to 10 carbon atoms and having one or more carbon-carbon triple bonds. Examples thereof may include ethynyl, 2-propynyl and the like, but are not limited thereto.

In the present disclosure, an "aryl" means a monovalent substituent derived from aromatic hydrocarbon having 6 to 20 carbon atoms and having a single ring or a combination of two or more rings. In addition, a form of two or more rings being simply attached (pendant) or fused may also be included. Examples of such aryl may include phenyl, naphthyl, phenanthryl, anthryl and the like, but are not limited thereto.

In the present disclosure, a "heteroaryl" means a monovalent substituent derived from monoheterocyclic or polyheterocyclic aromatic hydrocarbon having 5 to 20 nuclear atoms. Herein, one or more carbons, preferably, 1 to 3 carbons in the ring are substituted with heteroatoms such as N, O, S or Se. In addition, a form of two or more rings being simply attached (pendant) or fused may also be included, and furthermore, a form fused with an aryl group may also be included. Examples of such heteroaryl may include 6-membered monocyclic rings such as pyridyl, pyrazinyl, pyrimidinyl, pyridazinyl or triazinyl; polycyclic rings such as phenoxathienyl, indolizinyl, indolyl, purinyl, quinolyl, benzothiazole or carbazolyl; 2-furanyl, N-imidazolyl, 2-isoxazolyl, 2-pyridinyl, 2-pyrimidinyl and the like, but are not limited thereto.

In the present disclosure, an "aryloxy" is a monovalent substituent represented by RO—, and R means aryl having 6 to 20 carbon atoms. Examples of such aryloxy may include phenyloxy, naphthyloxy, diphenyloxy and the like, but are not limited thereto.

In the present disclosure, an "alkyloxy" is a monovalent substituent represented by R'O—, and R' means alkyl having 1 to 10 carbon atoms, and may include a linear, branched or cyclic structure. Examples of the alkyloxy may include methoxy, ethoxy, n-propoxy, 1-propoxy, t-butoxy, n-butoxy, pentoxy and the like, but are not limited thereto.

In the present disclosure, a "cycloalkyl" means a monovalent substituent derived from monocyclic or polycyclic non-aromatic hydrocarbon having 3 to 10 carbon atoms. Examples of such cycloalkyl may include cyclopropyl, cyclopentyl, cyclohexyl, norbornyl and the like, but are not limited thereto.

In the present disclosure, a "heterocycloalkyl" means a monovalent substituent derived from non-aromatic hydrocarbon having 3 to 10 nuclear atoms, and one or more carbons, preferably, 1 to 3 carbons in the ring are substituted with heteroatoms such as N, O, S or Se. Examples of such heterocycloalkyl may include morpholine, piperazine and the like, but are not limited thereto.

In the present disclosure, a potential metal is, for example, aluminum (Al), but is not limited to the example. A transition metal is, for example, copper, but is not limited to the example. In addition, a metal oxide is, for example, indium gallium zinc oxide or indium zinc oxide, but is not limited to the example.

In an LCD-TFT process using a potential metal having relatively lower electrical conductivity compared to a transition metal, a rate of producing a degenerated photoresist is high when progressing a hard baked process, an implant process and a dry etch process, and therefore, it is difficult to remove a photoresist compared to a process condition of a copper metal wire, a transition metal. However, when a metal wire is a transition metal, chemical bonding with alien substances is with an outermost p orbital, and in a potential metal, bonding is with a D orbital, and therefore, alien substances adsorbed to the transition metal more strongly and readily bond than alien substances adsorbed to the potential metal. Due to such a reason, occurrences of defects caused by alien substance adsorption for the transition metal wire are more readily observed than for the potential metal, and such alien substances adsorbed to the metal surface cause defects in follow-up processes.

As for metal corrosion, different properties are obtained for each membrane material. Aluminum and metal oxides are corroded by hydroxides formed by an amine component in a stripper, and in copper, corrosion directly occurs on the amine component in the stripper. The corrosion reaction is as follows.

(1) Corrosion reaction of amine and copper in aqueous solution state $$RNH_2 + H_2O \rightarrow RNH_3^+ + OH^-$$

$$Cu^{2+} + 2OH^- \rightarrow Cu(OH)_2(s)$$

$$Cu(OH)_2(s) + 4RNH_3^+ \rightarrow [Cu(RNH_2)_4]$$

(2) Corrosion reaction of amine and copper in organic solution state $$Cu + 4RNH_2 \rightarrow Cu(RNH_2)_4$$

(3) Corrosion reaction of amine and aluminum in aqueous solution state $$RNH_2 + H_2O \rightarrow RNH_3^+ + OH^-$$

$$2Al + 2OH^- + 6H_2O \rightarrow 2Al(OH)_4^- + 3H_2$$

In order to resolve such a problem of corrosion, an aqueous stripper composition including an alkanolamine has been used in the art, and in this case, a corrosion inhibitor suitable to each needs to be used. Depending on the alkanolamine type used in the stripper, Al, Cu, and oxide semiconductor films may be seriously damaged selectively. For preventing the damage, a corrosion inhibitor suitable to each of Al, Cu and an oxide semiconductor is added.

In addition, in a photoresist stripper including water, water volatilizes depending on the time of use when progressing a TFT-LCD photoresist stripping process, and corrosion inhibition and photoresist stripping abilities of a corrosion inhibitor rapidly change due to changes in the water content of the stripper. Accordingly, the corrosion inhibitor mentioned in the present disclosure needs to have properties capable of being used in an organic-type stripper with all the water being evaporated as a process progresses rather than being limited to just an aqueous stripper.

One embodiment of the present disclosure relates to a photoresist stripper composition for manufacturing an LCD including (a) a potential metal and metal oxide corrosion inhibitor of the following Chemical Formula 1 in 0.01% by weight to 3% by weight; (b) a transition metal corrosion inhibitor of the following Chemical Formula 2 in 0.01% by weight to 3% by weight; (c) a primary alkanolamine in 1% by weight to 20% by weight; (d) a cyclic alcohol in 1% by weight to 30% by weight; (e) water in 0.1% by weight to 40% by weight; (f) an aprotic polar organic solvent in 1% by weight to 40% by weight; and (g) a protic polar organic solvent in 20% by weight to 60% by weight. The water preferably means deionized water.

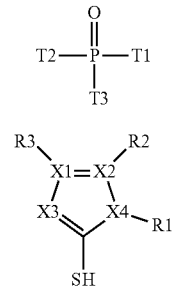

<Chemical Formula 1>

<Chemical Formula 2>

In Chemical Formula 1 and Chemical Formula 2, T1 and T2 are —O⁻NH₄⁺ or —O—H, T3 is —O—R or —R', R and R' are selected from the group consisting of hydrogen, a substituted or unsubstituted $C_1$ to $C_{12}$ alkyl group, a substituted or unsubstituted $C_2$~$C_{12}$ alkenyl group, a substituted or unsubstituted $C_2$~$C_{12}$ alkynyl group, an alkyl acid, a substituted or unsubstituted $C_3$~$C_{12}$ cycloalkyl group, a heterocycloalkyl group having 3 to 10 nuclear atoms, a $C_6$~$C_{20}$ aryl group, a heteroaryl group having 5 to 20 nuclear atoms, a $C_1$~$C_{12}$ alkyloxy group and a $C_6$~$C_{12}$ aryloxy group, X1, X2, X3 and X4 are C, N or O, R1 is selected from the group consisting of a substituted or unsubstituted $C_1$~$C_5$ alkyl group, a substituted or unsubstituted $C_2$~$C_5$ alkenyl group and a substituted or unsubstituted $C_2$~$C_5$ alkynyl group, and when X4 is O, R1 is not present, R2 and R3 are selected from the group consisting of a substituted or unsubstituted $C_1$ to $C_8$ alkyl group, a substituted or unsubstituted $C_2$~$C_8$ alkenyl group, a substituted or unsubstituted $C_2$~$C_8$ alkynyl group, a $C_3$~$C_8$ cycloalkyl group, a heterocycloalkyl group having 3 to 8 nuclear atoms, a $C_6$~$C_{20}$ aryl group, a heteroaryl group having 5 to 20 nuclear atoms, a $C_1$~$C_5$ alkyloxy group and a $C_6$~$C_{10}$ aryloxy group.

One embodiment of the present disclosure relates to a photoresist stripper composition for manufacturing an LCD, wherein the potential metal and metal oxide corrosion inhibitor is the following Chemical Formula 3.

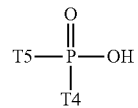

<Chemical Formula 3>

In Chemical Formula 3, T4 is —O—H or —O⁻NH₄⁺, and T5 is —O—NH₂ or a substituted or unsubstituted $C_1$ to $C_{12}$ alkyl group.

One embodiment of the present disclosure relates to a photoresist stripper composition for manufacturing an LCD, wherein the transition metal corrosion inhibitor is the following Chemical Formula 4 or Chemical Formula 5.

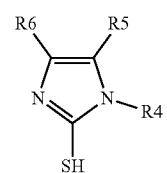

<Chemical Formula 4>

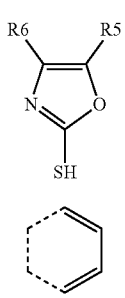

<Chemical Formula 5>

<Chemical Formula 6>

In Chemical Formula 4 and Chemical Formula 5, R4 is hydrogen or a substituted or unsubstituted $C_1$ to $C_5$ alkyl group, and R5 and R6 may be H or form a ring by being fused with a ring represented by Chemical Formula 6.

One embodiment of the present disclosure relates to a photoresist stripper composition for an LCD, wherein the transition metal corrosion inhibitor is any one or more selected from the group consisting of mercaptomethylimidazole, mercaptobenzimidazole, mercaptobenzothiadiazole and mercaptobenzioxazole. The transition metal corrosion inhibitor has relatively stable corrosion inhibition and photoresist stripping abilities regardless of changes in the water content when using an azole-based compound including a mercapto group as a corrosion inhibitor. The transition metal corrosion inhibitor is included in 0.01% by weight to 3% by weight, and when included in less than 0.01%, a corrosion inhibition effect is hardly obtained, and being included in greater than 3% by weight has a problem of weakening a photoresist stripping ability.

As one embodiment of the present disclosure, the potential metal and metal oxide corrosion inhibitor is any one or more selected from the group consisting of monoammonium phosphate, diammonium phosphate, triammonium phosphate, methylphosphonic acid, ethylphosphonic acid, propylphosphonic acid, butylphosphonic acid, tert-butylphosphonic acid, pentylphosphonic acid, n-hexylphosphonic acid, triethyl phosphate, tripropyl phosphate, octylphosphonic acid, decylphosphonic acid, dodecylphosphonic acid, tetradecylphosphonic acid, octadecylphosphonic acid, hexyl phosphate, heptyl phosphate, octyl phosphate, nonyl phosphate, decyl phosphate and dodecyl phosphate. Materials such as catechol, a potential metal corrosion inhibitor that has been generally used, is classified as a carcinogen, and due to the current industrial nature, carcinogens are impossible to use in new products due to environmental regulations. In addition, when used with a transition metal corrosion inhibitor, existing potential metal corrosion inhibitors have disadvantages in that copper corrosion is progressed more by decomposing the corrosion inhibitor or reducing a capability of the transition metal corrosion inhibitor. The potential metal and metal oxide corrosion inhibitor is included in 0.01% by weight to 3% by weight. When included in less than 0.01% by weight, corrosion inhibition effects are hardly obtained, and being included in greater than 3% by weight has a problem of enhancing corrosion for copper (transition metal) by affecting basicity of the stripper.

As one embodiment of the present disclosure, the primary alkanolamine is any one or more selected from the group consisting of monoethanolamine, monoisopropanolamine, 2-amino-2-methyl-1-propanol and aminoethoxyethanol.

As one embodiment of the present disclosure, the cyclic alcohols are any one or more selected from the group consisting of tetrahydrofurfuryl alcohol, furfuryl alcohol and isopropylidene glycerol. Generally, aqueous strippers use water with a low boiling point unlike other organic-type strippers, and therefore, the amount of water volatilization increases depending on the process application condition, and the amount removed by volatilization during an actual process is considerable since active components evaporate together due to a partial vapor pressure. In order to resolve such a problem, cyclic alcohols are used to lower the amount of evaporation compared to when present with linear molecules due to an azeotropic effect, and the amount of volatilization of an alkanolamine, an active component, may be controlled.

As one embodiment of the present disclosure, the aprotic polar organic solvent is any one or more selected from the group consisting of N-methyl pyrrolidone, diethylformamide, dimethylpropionamide, N-methylformamide (NMF), dimethyl sulfoxide (DMSO), dimethylacetamide (DMAc), dipropylene glycol monomethyl ether (DPM), diethyl sulfoxide, dipropyl sulfoxide, sulfolane, pyrrolidone, N-ethyl pyrrolidone, equamide and alkylcarboxamide. The aprotic polar organic solvent is included in 1% by weight to 40% by weight, and the aprotic polar organic solvent being included in less than 1% has a problem of lowering an ability to remove a degenerated photoresist, and being included in greater than 40% by weight has a problem of modest profits with respect to costs.

As one embodiment of the present disclosure, the protic polar organic solvent is any one or more selected from the group consisting of, as glycol ether, ethylene glycol, propylene glycol, diethylene glycol monoethyl ether, diethylene glycol monobutyl ether (BDG), diethylene glycol monomethyl ether, ethylene glycol monoethyl ether, ethylene glycol monobutyl ether, propylene glycol monomethyl ether, propylene glycol monoethyl ether, propylene glycol monobutyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobutyl ether, triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether and tripropylene glycol monobutyl ether. The protic polar organic solvent is included in 20% by weight to 60% by weight. The protic polar organic solvent being included in less than 20% by weight has a problem of lowering a photoresist stripping ability, and being included in greater than 60% by weight has a problem of modest profits with respect to costs.

One embodiment of the present disclosure relates to a photoresist stripper composition for an LCD, which does not include water. A photoresist stripper composition including water is referred to as an aqueous stripper, and a photoresist stripper composition that does not include water is referred to as an organic stripper. Even when preparing an organic stripper besides an aqueous stripper, the photoresist stripper composition has an excellent ability to remove a degenerated photoresist produced after progressing a hard baked process, an implant process and a dry etch process in a semiconductor or flat display panel process, may be used in aluminum that is a potential metal, copper or silver that is a transition metal, and metal oxide wires at the same time, and may also be introduced to organic film and COA processes.

Advantageous Effects

The present disclosure relates to a photoresist stripper composition for manufacturing an LCD, and relates to an integrated photoresist stripper composition capable of being used in all processes for manufacturing a TFT-LCD. The photoresist stripper composition for manufacturing an LCD of the present disclosure has an excellent ability to remove a degenerated photoresist produced after progressing a hard baked process, an implant process and a dry etch process in a semiconductor or flat display panel process, can be used in aluminum that is a potential metal, copper or silver that is a transition metal, and metal oxide wires at the same time, and can be introduced to organic film and COA processes.

MODE FOR DISCLOSURE

Hereinafter, preferred embodiments of the present disclosure will be described.

As a photoresist stripper constituent of the present disclosure, an azole-based compound including a mercapto group that is a transition metal corrosion inhibitor is used in 0.01% by weight to 3% by weight as a corrosion inhibitor. When the corrosion inhibitor is included in less than 0.01% by weight, a corrosion inhibition effect for a metal wire film is hardly obtained, and particularly, depending on the type of an alkanolamine used, decline in the corrosion inhibition effect is severe as the water amount decreases when the corrosion inhibitor content is low. When the corrosion inhibitor is included in greater than 3% by weight on the contrary, a photoresist stripping ability becomes weak. When introducing the corrosion inhibitor in 3% by weight in the composition of the present disclosure, it is identified that corrosion inhibition and stripping abilities are maintained. However, the corrosion inhibitor is high-price, and therefore, excess introduction of more than an adequate amount is not necessary.

As an aluminum corrosion inhibitor, a potential metal corrosion inhibitor, an alkali phosphate and an alkali phosphonic acid are included. Such corrosion inhibitors are included in order to further enhance a corrosion inhibition ability of Mo, Al and the like, but, when included in greater than 3% by weight, corrosion for copper is enhanced by affecting basicity of the stripper, and therefore, it is not necessary to use the corrosion inhibitor in excess.

The photoresist stripper composition according to the present disclosure is an aqueous type including water. An aqueous stripper including water further activates basicity of amine compared to an organic stripper. Accordingly, an ability to remove a degenerated photoresist remaining after progressing a hard baked process, an implant process and a dry etch process in a flat display panel process is significantly superior compared to generally used organic strippers for an LCD even when a low process temperature is used. Using a low process temperature allows to reduce manufacturing costs of a flat display panel. In addition, by using an optimal corrosion inhibitor for the stripper composition of the present disclosure, the stripper composition may be used in both aluminum and copper wires, and may also be introduced to organic film and COA processes.

Mixing one or more glycols as a protic polar organic solvent may effectively assist photoresist stripping. Glycols perform a role of favorably spreading a dissolved photoresist into a stripper and helps with rapid removal. The glycol mentioned above has a structure of R—O(CH$_2$CH$_2$O)H, and herein, 'R' refers to any one of linear hydrocarbon, branched hydrocarbon and cyclic hydrocarbon, and n is an integer of 1 or greater.

More specifically, diethylene glycol monomethyl ether (MDG), diethylene glycol monoethyl ether (EDG), diethylene glycol monobutyl ether (BDG), triethylene glycol ether (TEG), ethylene glycol (EG), propylene glycol (PG) or the like may be used. A composition of the glycols is properly from 20% to 60% in a weight ratio in the total composition ratio, and one, or a mixture of two or more of those corresponding to R—O(CH$_2$CH$_2$O)H described above may be used. Herein, 'R' refers to any one of linear hydrocarbon, branched hydrocarbon and cyclic hydrocarbon, and n is an integer of 1 or greater Cyclic alcohols reduce the amount of volatilization of the stripper, and control evaporation of an alkanolamine, one of important active components in the product, to perform a role of maintaining product performance for a long period of time. The cyclic alcohols are, for example, $C_4$~$C_6$ cyclic alcohols, and specifically, any one or more selected from the group consisting of tetrahydrofurfuryl alcohol, furfuryl alcohol, cyclobutanol, cyclopentanol, cyclohexanol and isopropylidene glycerol, but are not limited to the examples. The total composition ratio of the cyclic alcohol is properly from 1% to 30% in a weight ratio, and one type, or a mixture of two or more types may be used.

A polar organic solvent performs a role of weakening polymer material bonding strength so as to readily remove a degenerated photoresist, and is specifically any one or more selected from the group consisting of N-methyl pyrrolidone, sulfolane, dimethyl sulfoxide, dimethylformamide, diethylformamide, dimethylpropionamide and dimethylacetoacetamide, but are not limited to the examples. The polar organic solvent is from 1% by weight to 40% by weight, and one type, or a mixture of two or more types may be used.

In order to evaluate performance of the photoresist stripper composition of the present disclosure, the amount of volatilization and the condition of changes in the composition when placing the stripper composition at a process progressing temperature were evaluated as follows.

Example 1

Evaluation on Amount of Volatilization with Use of Cyclic Alcohol

A stripper mixed under each evaluation condition was kept on a hot plate at 50° C., a temperature used in the process, and while storing the striper for 48 hours, comparison on the volatized evaporation amount was measured in a weight ratio, and a ratio of changes in the components of an alkanolamine, a major component, and a polar organic solvent was measured under each condition. As materials compared with a cyclic alcohol, materials having the same molecular weight and constituents, and similar boiling points were evaluated, and analysis on the major component was carried out using gas chromatography.

As Comparative Example 1 and Comparative Example 2 for a cyclic alcohol, linear-structured materials having a similar chemical formula (octanol, decyl alcohol) were selected, and materials having a similar boiling point as well were selected to perform the evaluation.

Based on the results of the following Table 1, it was identified that results of decreasing a relative amount of volatilization were obtained when using a cyclic alcohol to a product (Example 1 and Example 2) regardless of the alkanolamine type. In addition, it was identified that the range of variation in the alkanolamine concentration capable of determining product performance was also very small when using a cyclic alcohol.

In other words, it was identified that, although changes in the weight were measured as from −15% to −27% after leaving the stripper unattended for 24 hours at 50° C. in Examples 1 and 2, changes in the content of the alkanolamine for removing a photoresist were approximately from −3.5% to 0% meaning that the content hardly decreased. Meanwhile, when introducing a linear alcohol instead of a cyclic alcohol (Comparative Example 1 and Comparative Example 2), changes in the weight after leaving the stripper unattended for 24 hours at 50° C. were similar as in Examples 1 and 2 using a cyclic alcohol, however, the amount of variation in the alcoholamine was measured as from −1.3% to −1%.

TABLE 1

Example of Evaluation on Amount of Volatilization with Use of Cyclic Alcohol

| Number | Alkanolamine Type and Content | Comparative Material and Content | Ultrapure Water Content | Other Organic Solvent and Content | Weight Variation after Being Left Unattended for 24 Hours at 50° C. | Amine Variation after Being Left Unattended for 24 Hours at 50° C. |
|---|---|---|---|---|---|---|
| Example 1 | MEA 10% Primary Amine | THFA 10% | 25% | NMP 20% EDG 45% | −16% | −0.3% |
|  |  | FA 10% | 25% | NMP 20% EDG 45% | −18% | −0.3% |
|  |  | GA 10% | 25% | DEF 20% EDG 45% | −25% | −2% |
|  |  | PA 10% | 25% | DMPA 20% EDG 45% | −27% | −3.5% |
| Example 2 | MIPA 10% Primary Amine | THFA 10% | 25% | DEF 20% EDG 45% | −15% | 0% |
|  |  | FA 10% | 25% | NMP 20% EDG 45% | −19% | 0% |
|  |  | GA 10% | 25% | NMP 20% EDG 45% | −26% | 0% |
|  |  | PA 10% | 25% | NMP 20% EDG 45% | −25% | 0% |
| Comparative Example 1 | MEA 10% Primary Amine | Decyl alcohol 10% | 25% | NMP 20% EDG 45% | −26% | −1.3% |
| Comparative Example 2 | MIPA 10% Primary Amine | Octanol 10% | 25% | NMP 20% EDG 45% | −24% | −1.0% |

MEA: Monoethanolamine
MIPA: Monoisopropanolamine
NMP: N-methyl pyrrolidone
THFA: Tetrahydrofurfuryl alcohol
GA: Glutaraldehyde
PA: Pivalic acid
EDG: Diethylene glycol monoethyl ether
FA: Furfuryl alcohol
DEF: Diethylformamide
DMPA: Dimethylpropionamide Example 2

Evaluation on Metal Corrosion and Degenerated Photoresist Stripping

Constituents and content of the photoresist stripper are as listed in the following Table 2. In addition to the components of the following Table 2, ultrapure water was introduced in 35% by weight, a transition metal corrosion inhibiter was introduced in 0.05% by weight, and a potential metal and metal oxide corrosion inhibitor was introduced in 0.225% by weight of each corrosion inhibitor when using two types of potential metal and metal oxide corrosion inhibitors, and in 0.05% by weight when using one type only.

TABLE 2

|  | Alkanol amine 5% by weight | Cyclic Alcohol 15% by weight | Polar Organic Solvent 15% by weight | Glycol Ether 29.9% by weight | Metal Oxide Corrosion Inhibitor | Potential Metal Corrosion Inhibitor | Transition Metal Corrosion Inhibitor |
|---|---|---|---|---|---|---|---|
| Example 1 | MEA | THFA | NMP | EDG | HPA | DAP | MMI |
| Example 2 | MIPA | FA | DEF | BDG | OPA | AP | MBI |
| Example 3 | AEE | THFA | DMPA | EG | DPA | DAP | MBO |
| Example 4 | AEEOA | THFA | Sulfolane | PG | DDPA | AP | MBTO |

TABLE 2-continued

|  | Alkanol amine 5% by weight | Cyclic Alcohol 15% by weight | Polar Organic Solvent 15% by weight | Glycol Ether 29.9% by weight | Metal Oxide Corrosion Inhibitor | Potential Metal Corrosion Inhibitor | Transition Metal Corrosion Inhibitor |
|---|---|---|---|---|---|---|---|
| Example 5 | MEA | THFA | NMP | EDG | HPA | TMPA | MMI |
| Example 6 | MIPA | FA | DEF | BDG | OPA | — | MBI |
| Example 7 | AEE | THFA | NEF | EG | DPA | — | MBO |
| Example 8 | AEEOA | THFA | GA | PG | BPA | — | MBTO |
| Comparative Example 1 | MEA | THFA | NMP | EDG | EPA | AP | BTA |
| Comparative Example 2 | AEE | THFA | DMPA | EG | DPA | — | MG |
| Comparative Example 3 | AEEOA | THFA | Sulfolane | PG | BPA | CAT | TTA |
| Comparative Example 4 | AEE | THFA | DMPA | EG | MPA | — | MG |
| Comparative Example 5 | AEEOA | THFA | PA | PG | EPA | XT | TTA |
| Comparative Example 6 | AEEOA | THFA | DEF | PG | EPA | LG | TTA |

MEA: Monoethanolamine
MIPA: Monoisopropanolamine
AEE: Aminoethoxyethanol
AEEOA: Aminoethylethanolamine
NMP: N-methyl pyrrolidone
THFA: Tetrahydrofurfuryl alcohol
GA: Glutaraldehyde
PA: Pivalic acid
EDG: Diethylene glycol monoethyl ether
BDG: Diethylene glycol monobutyl ether
EG: Ethylene glycol Sulfolane
PG: Propylene glycol (Propylene glycol)
NEF: N-ethylformamide
FA: Furfuryl alcohol
DEF: Diethylformamide
DMPA: Dimethylpropionamide
TEP: Triethylphosphonic acid
AP: Ammonium phosphate
TMP: Trimethyl phosphate
OPA: Octylphosphonic acid
XT: Xylitol
LG: Lauryl gallate
MBTO: Mercapbenzothiadiazole
CAT: Catechol
HPA: Hexylphosphonic acid
DPA: Decylphosphonic acid
DDPA: Dodecylphosphonic acid
DAP: Dibasic ammonium phosphate
AP: Ammonium phosphate
TMPA: Trimethylphosphonic acid
MBI: Mercaptobenzimidazole
MBO: Mercaptobenzoxaole
MBTO: Mercaptobenzothiadiazole
MMI: Mercaptomethylimidazole
BPA: Butylphosphonic acid
EPA: Ethylphosphonic acid
TTA: Toluenetriazole
MG: Methyl gallate
BTA: Benzotriazole

TABLE 3

|  | Example 1 | Example 2 | Example 3 | Example 4 | Example 5 | Example 6 | Example 7 | Example 8 |
|---|---|---|---|---|---|---|---|---|
| Metal Oxide Corrosion Result | ○ | ○ | ○ | ○ | ○ | ○ | ○ | ○ |
| Transition Metal Corrosion Result | ○ | ○ | ○ | ○ | ○ | ○ | ○ | ○ |
| Potential Metal Corrosion Result | ○ | ○ | ○ | ○ | ○ | ○ | ○ | ○ |

TABLE 3-continued

|  | | | | | | | | |
|---|---|---|---|---|---|---|---|---|
| Degenerated PR Stripping Ability | ○ | ○ | ○ | ○ | ○ | ○ | ○ | ○ |

|  | Comparative Example 1 | Comparative Example 2 | Comparative Example 3 | Comparative Example 4 | Comparative Example 5 | Comparative Example 6 |
|---|---|---|---|---|---|---|
| Metal Oxide Corrosion Result | X | ○ | ○ | Δ | X | X |
| Transition Metal Corrosion Result | ○ | Δ | ○ | X | ○ | ○ |
| Potential Metal Corrosion Result | ○ | ○ | ○ | ○ | ○ | Δ |
| Degenerated PR Stripping Ability | X | ○ | X | ○ | ○ | ○ |

[Metal Corrosion]

As a metal film material used to prepare FPD, Al, Cu, Ag and a metal oxide were used as wires. In order to progress with a corrosion property evaluation on such a metal film material, each metal film material-wired glass substrate was immersed for 10 minutes under a stripper temperature condition of 50° C., and corroded parts for each film material was evaluated through metal ion elution. As the elution for the metal ions, changed parts of the metal film material were checked using an ICP-MS analysis method and by taking photographs on the metal film material using an electron scanning microscope for the actual substrate. When checking with the electron scanning microscope, the evaluated metal film material was treated with acetone to use as a reference.

[Determination Criteria of Electron Scanning Microscope for Metal Corrosion]

O: Corrosion was not observed on the metal film material surface to the same degree as reference Δ: Thickness of the metal film material did not decrease, however, abnormal phenomenon was observed on the surface X: Thickness of the metal film material decreased, and abnormal phenomenon was observed on the surface

[Stripping Ability of Degenerated Photoresist]

As for the stripping ability for the degenerated photoresist, the dry etching-progressed substrate was immersed for 2 minutes under a stripper temperature condition of 50° C., and experiments on the ability of removing the degenerated photoresist (PR) present on the top and the side wall of the wire were carried out, and the results were identified using an electron scanning microscope.

[Determination Criteria of Electron Scanning Microscope for Metal Corrosion]

O: Degenerated PR was not observed

Δ: Degenerated PR remained locally

X: Degenerated PR was not removed

Based on the above-mentioned experimental results, complete stripping of a seriously degenerated photoresist and prevention of copper wire corrosion were both accomplished when using a transition metal corrosion inhibitor including an alkanolamine and an azole-based compound including a mercapto group in preparing an aqueous photoresist stripper. However, better price competitiveness and stronger photoresist removing ability are generally obtained when mixing water thereto.

In addition, as a corrosion inhibitor (potential metal and metal oxide corrosion inhibitor) for aluminum and a metal oxide to be included in a product using a transition metal corrosion inhibitor including an alkanolamine and an azole-based compound including a mercapto group in preparing an aqueous photoresist stripper, corrosion inhibitors having no influence on the effects need to be selected. Carboxylic acid-based corrosion inhibitors lower product basicity and may lower a stripping ability, and depending on the type, some corrosion inhibitors do not have a corrosion inhibition function for an oxide semiconductor while having a corrosion inhibition function for aluminum. As a corrosion inhibitor capable of resolving such a problem, phosphate or phosphonic acid, and aliphatic gallate-based corrosion inhibitors were identified to be suitable through the examples.

Example 3

Evaluation on Metal Corrosion and Degenerated Photoresist Stripping Depending on Changes in the Corrosion Inhibitor Content Example 9

* A photoresist stripper was prepared by introducing monoethanolamine in 5% by weight, tetrahydrofurfulyl alcohol in 15% by weight, N-methyl pyrrolidone in 15% by weight, diethylene glycol monoethyl ether in 29.98% by weight, ultrapure water in 35% by weight, n-hexylphosphonic acid in 0.005% by weight, mercaptomethylimidazole in 0.01% by weight and decyl phosphate in 0.005% by weight.

Example 10

A photoresist stripper was prepared in the same manner as in Example 9 except that the diethylene glycol monoethyl ether was introduced in 28% by weight, the n-hexylphosphonic acid in 0.5% by weight, the mercaptomethylimidazole in 1% by weight and the decyl phosphate in 0.5% by weight.

Example 11

A photoresist stripper was prepared in the same manner as in Example 9 except that the diethylene glycol monoethyl ether was introduced in 24% by weight, the n-hexylphosphonic acid in 1.5% by weight, the mercaptomethylimidazole in 3% by weight and the decyl phosphate in 1.5% by weight.

Comparative Example 7

A photoresist stripper was prepared in the same manner as in Example 9 except that the diethylene glycol monoethyl ether was introduced in 29.99% by weight, the n-hexylphosphonic acid in 0.0025% by weight, the mercaptomethylimidazole in 0.005% by weight and the decyl phosphate in 0.0025%.

Comparative Example 8

A photoresist stripper was prepared in the same manner as in Example 9 except that the diethylene glycol monoethyl ether was introduced in 22% by weight, the n-hexylphosphonic acid in 2% by weight, the mercaptomethylimidazole in 4% by weight and the decyl phosphate in 2% by weight.

TABLE 4

|  | Example 9 | Example 10 | Example 11 | Comparative Example 7 | Comparative Example 8 |
|---|---|---|---|---|---|
| Metal Oxide Corrosion Result | O | O | O | X | O |
| Transition Metal Corrosion Result | O | O | O | X | O |
| Potential Metal Corrosion Result | O | O | O | X | O |
| Degenerated PR Stripping Ability | O | O | O | Δ | X |

[Determination Criteria of Electron Scanning Microscope for Metal Corrosion]

O: Corrosion was not observed on the metal film material surface to the same degree as reference Δ: Thickness of the metal film material did not decrease, however, abnormal phenomenon was observed on the surface X: Thickness of the metal film material decreased, and abnormal phenomenon was observed on the surface

[Determination Criteria of Electron Scanning Microscope for Metal Corrosion]

O: Degenerated PR was not observed
Δ: Degenerated PR remained locally
X: Degenerated PR was not removed Through the descriptions provided above, it is obvious that those skilled in the art may make various changes and modifications within the range that does not depart from technological ideas of the present disclosure. Accordingly, the technological scope of the present disclosure is not limited to those described in detailed descriptions of the specification, and needs to be defined by the scope of the claims.

The invention claimed is:

1. A photoresist stripper composition for manufacturing an LCD comprising:
(a) a potential metal and metal oxide corrosion inhibitor in 0.01% by weight to 3% by weight, wherein the potential metal and metal oxide corrosion inhibitor is any one or more selected from the group consisting of monoammonium phosphate, diammonium phosphate, triammonium phosphate, methylphosphonic acid, ethylphosphonic acid, propylphosphonic acid, butylphosphonic acid, tert-butylphosphonic acid, pentylphosphonic acid, n-hexylphosphonic acid triethyl phosphate, tripropyl phosphate, octylphosphonic acid, decylphosphonic acid, dodecylphosphonic acid, tetradecylphosphonic acid, octadecylphosphonic acid, hexyl phosphate, heptyl phosphate, octyl phosphate, nonyl phosphate, decyl phosphate, and dodecyl phosphate;
(b) a transition metal corrosion inhibitor in 0.01% by weight to 3% by weight, wherein the transition metal corrosion inhibitor is any one or more selected from the group consisting of mercaptomethylimidazole, mercaptobenzothiadiazole and mercaptobenzoxazole;
(c) a primary alkanolamine in 1% by weight to 20% by weight;
(d) a cyclic alcohol in 1% by weight to 30% by weight;
(e) water in 0.1% by weight to 40% by weight;
(f) an aprotic polar organic solvent in 1% by weight to 40% by weight; and
(g) a protic polar organic solvent in 20% by weight to 60% by weight.

2. The photoresist stripper composition for manufacturing an LCD of claim 1, wherein the primary alkanolamine is any one or more selected from the group consisting of monoethanolamine, monoisopropanolamine, 2-amino-2-methyl-1-propanol and aminoethoxyethanol.

3. The photoresist stripper composition for manufacturing an LCD of claim 1, wherein the cyclic alcohol is any one or more selected from the group consisting of tetrahydrofurfuryl alcohol, furfuryl alcohol and isopropylidene glycerol.

4. The photoresist stripper composition for manufacturing an LCD of claim 1, wherein the aprotic polar organic solvent is any one or more selected from the group consisting of N-methyl pyrrolidone, diethylformamide, dimethylpropionamide, N-methylformamide (NMF), dimethyl sulfoxide (DMSO), dimethylacetamide (DMAC), dipropylene glycol monomethyl ether (DPM), diethyl sulfoxide, dipropyl sulfoxide, sulfolane, pyrrolidone, N-ethyl pyrrolidone, equamide and alkylcarboxamide.

5. The photoresist stripper composition for manufacturing an LCD of claim 1, wherein the protic polar organic solvent is any one or more selected from the group consisting of, as glycol ether, ethylene glycol, propylene glycol, diethylene glycol monoethyl ether, diethylene glycol monobutyl ether (BDG), diethylene glycol monomethyl ether, ethylene glycol monoethyl ether, ethylene glycol monobutyl ether, propylene glycol monomethyl ether, propylene glycol monoethyl ether, propylene glycol monobutyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobutyl ether, triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether and tripropylene glycol monobutyl ether.

6. The photoresist stripper composition according to claim 1, wherein the potential metal and metal oxide corrosion inhibitor includes one or more of one or more selected from the group consisting of methylphosphonic acid, ethylphosphonic acid, propylphosphonic acid, butylphosphonic acid, tert-butylphosphonic acid, pentylphosphonic acid, n-hexylphosphonic acid octylphosphonic acid, decylphosphonic acid, dodecylphosphonic acid, tetradecylphosphonic acid, and octadecylphosphonic acid.

7. The photoresist stripper composition according to claim 6, wherein the potential metal and metal oxide corrosion inhibitor further includes one or more of one or more selected from the group consisting of monoammonium phosphate, diammonium phosphate, triammonium phosphate, triethyl phosphate, tripropyl phosphate, hexyl phosphate, heptyl phosphate, octyl phosphate, nonyl phosphate, decyl phosphate, and dodecyl phosphate.

* * * * *